US008716701B2

(12) United States Patent
So et al.

(10) Patent No.: US 8,716,701 B2
(45) Date of Patent: May 6, 2014

(54) METHOD AND APPARATUS FOR PROVIDING A CHARGE BLOCKING LAYER ON AN INFRARED UP-CONVERSION DEVICE

(75) Inventors: Franky So, Gainesville, FL (US); Do Young Kim, Gainesville, FL (US); Dong Woo Song, Seoul (KR); Galileo Sarasqueta, Chandler, AZ (US); Bhabendra K. Pradhan, Marietta, GA (US)

(73) Assignees: Nanoholdings, LLC, Rowayton, CT (US); University of Florida Research Foundation, Inc., Gainesville, FL (US)

( * ) Notice: Subject to any disclaimer, the term of this patent is extended or adjusted under 35 U.S.C. 154(b) by 193 days.

(21) Appl. No.: 13/114,896

(22) Filed: May 24, 2011

(65) Prior Publication Data

US 2012/0187295 A1    Jul. 26, 2012

Related U.S. Application Data

(60) Provisional application No. 61/347,696, filed on May 24, 2010.

(51) Int. Cl.
*G01J 5/20* (2006.01)
*H01L 51/54* (2006.01)

(52) U.S. Cl.
USPC ............................................ 257/40; 257/340

(58) Field of Classification Search
USPC ......................................................... 250/340
See application file for complete search history.

(56) References Cited

U.S. PATENT DOCUMENTS

| 5,438,198 | A | 8/1995 | Ebitani et al. |
| 5,619,039 | A | 4/1997 | Montanari |
| 6,734,452 | B2 | 5/2004 | Gunapala et al. |
| 2006/0032528 | A1* | 2/2006 | Wang ............................ 136/263 |
| 2011/0012091 | A1* | 1/2011 | Forrest et al. ................... 257/40 |

FOREIGN PATENT DOCUMENTS

| EP | 0 508 970 A1 | 10/1992 |
| EP | 0 569 257 B1 | 6/2002 |
| JP | 10-065200 A | 3/1998 |

(Continued)

OTHER PUBLICATIONS

Chikamatsu, M., et al., "Light Up-Conversion from Near-Infrared to Blue Using a Photoresponsive Organic Light-Emitting Device," *Applied Physics Letters*, Jul. 22, 2002, vol. 81, No. 4, pp. 769-771.

(Continued)

*Primary Examiner* — Matthew W Such
*Assistant Examiner* — Robert Carpenter
(74) *Attorney, Agent, or Firm* — Wolf, Greenfield & Sacks, P.C.

(57) ABSTRACT

Embodiments of the invention are directed to an improved device for sensing infrared (IR) radiation with upconversion to provide an output of electromagnetic radiation having a shorter wavelength than the incident IR radiation, such as visible light. The device comprises an anode, a hole blocking layer to separate an IR sensing layer from the anode, an organic light emitting layer that is separated from the anode by the IR sensing layer, and a cathode. The hole blocking layer assures that when a potential is applied between the anode and the cathode the organic light emitting layer generates electromagnetic radiation only when the IR sensing layer is irradiated with IR radiation.

42 Claims, 7 Drawing Sheets

(56) References Cited

FOREIGN PATENT DOCUMENTS

| WO | WO-02/099896 A1 | 12/2002 |
| WO | WO 2008042859 A2 * | 4/2008 |
| WO | WO-2011/066396 A2 | 6/2011 |

OTHER PUBLICATIONS

Kim, D.Y., et al., "Organic Infrared Upconversion Device," *Advanced Materials*, May 25, 2010, vol. 22, No. 20, pp. 2260-2263.

* cited by examiner w/o HBL

METHOD AND APPARATUS FOR PROVIDING A CHARGE BLOCKING LAYER ON AN INFRARED UP-CONVERSION DEVICE

CROSS-REFERENCE TO RELATED APPLICATION

The present application claims the benefit of U.S. Provisional Application Ser. No. 61/347,696, filed May 24, 2010, which is hereby incorporated by reference herein in its entirety, including any figures, tables, or drawings.

BACKGROUND OF INVENTION

Infrared (IR)-to-visible light up-conversion devices have attracted a great deal of research interest due to the potential application in night vision, range finding, security, and semiconductor wafer inspections. Early near infrared (NIR) up-conversion devices were mostly based on the heterojunction structure of inorganic semiconductors. These devices consist of two parts in series: one part for photodetection and another for luminescence. The up-conversion devices are mainly distinguished by the method of photodetection. Up-conversion efficiencies of these devices are generally low. For example, one NIR-to-visible light up-conversion device that integrates a light-emitting diode (LED) with a semiconductor based photodetector exhibits a maximum external conversion efficiency of 0.3%. A hybrid organic/inorganic up-conversion device, having an inorganic InGaAs/InP photodetector integrated with an organic light-emitting diode (OLED), exhibits an external conversion efficiency of only 0.25%. Such inorganic and hybrid up-conversion devices are expensive to fabricate and processes and their fabrication is not compatible with large area applications.

Ni et al., *Jpn. J. Appl. Phys.* 2001, 40, L948 and Chikamatsu et al. *Appl. Phys. Lett.* 2002, 81, 769 disclose all organic up-conversion devices by coupling fluorescent OLEDs with a titanyl phthalocyanine (TiOPc) photosensitive hole injection layer to exhibited NIR-to-blue and red-to-green up-conversion, respectively. These all organic up-conversion devices display very low conversion efficiencies (less than 0.05%). The photodetectors used in the up-conversion devices have low quantum efficiencies, as the organic sensitizer yield photogenerated excitons having low charge-dissociation efficiency and the fluorescent OLEDs exhibit external quantum efficiencies (EQEs) of less than 5%, resulting in the low overall up-conversion efficiencies.

BRIEF SUMMARY

Embodiments of the invention are directed to a device for sensing infrared (IR) radiation and providing an output of higher energy electromagnetic radiation that includes an anode, a hole blocking layer (HBL) that separates the anode from an IR sensing layer, an organic light emitting layer that is separated from the anode by the IR sensing layer, and a cathode. Holes and electrons combine in the organic photon emitting layer to generate electromagnetic radiation, upon applying a potential between the anode and the cathode, when IR radiation strikes the IR sensing layer. In specific embodiments, one or both of the anode and cathode is transparent. In specific embodiments, the anode can be made from a material selected from the following: ITO, IZO, ATO, AZO, and carbon nanotubes, and the cathode can be made from a material selected from the following: LiF/Al, Ag, Ca:Mg, LiF/Al/ITO, Ag/ITO, CsCO$_3$/ITO, and Ba/Al. The hole blocking layer can incorporate BCP, UGH2, BPhen, Alq$_3$, mCP, C$_{60}$, 3TPYMB, ZnO nanoparticles, and/or any combination thereof. The organic photon emitting layer can be made from a material selected from the following: MEH-PPV, Alq$_3$, and FIrpic. The IR photodetecting layer can be made from an organic material, such as SnPc, SnPc:C$_{60}$, AlPcCl, AlPcCl:C$_{60}$, TiOPc, or TiOPc:C$_{60}$, or it can be made from an inorganic material such as PbSe or PbS. In embodiments of the invention the device can include one or more charge transport layers made from materials such as TAPC, NPB, or TPD to transport holes, and/or 3TPYMB, BCP, BPhen, and Alq$_3$ to transport electrons.

BRIEF DESCRIPTION OF DRAWINGS

FIG. 1A shows the schematic energy band diagram under no applied voltage in the dark and FIG. 1B shows the schematic energy band diagram even under low applied voltage in the dark.

FIG. 2A shows the schematic energy band diagram under no applied voltage in the dark, FIG. 2B shows the schematic energy band diagram even under high applied voltage in the dark, and FIG. 2C shows the schematic energy band diagram wider applied voltage in the IR irradiation.

DETAILED DISCLOSURE

High-efficiency organic light-emitting devices, such as organic light-emitting diodes (OLEDs) and high efficiency organic photodetectors, have been demonstrated and an all organic up-conversion device has been disclosed by the inventors where an OLED and an IR photodetector are integrated into one device. (see Kim et al., PCT Patent Application No. PCT/US2010/058015, filed Nov. 24, 2010 and Kim et al. *Adv. Mater.* 2010, 22, 2260-3, both of which are hereby incorporated by reference herein in their entirety and, in particular, are incorporated for their teachings of organic photodetectors and all organic up-conversion devices, for example, an organic light-emitting device, such as an OLED, and an IR photodetector integrated into one device). Because of their compatibility with lightweight rugged flexible plastic substrates, an all organic up-conversion device can permit applications unavailable to other more conventional technologies. Unfortunately, even in the absence of IR irradiation, an off state, organic up-conversion device can still give off visible light, due to the small difference between the work function of the anode and the highest occupied molecular orbit (HOMO) of the IR absorbing photodetector at low voltages.

Figure 1A:
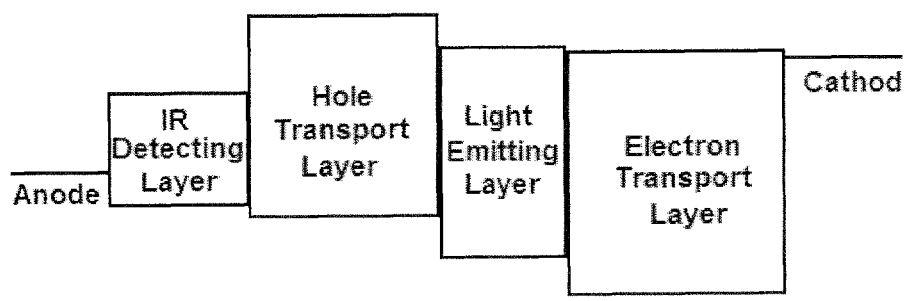
FIGS. 1A-1B show a schematic energy diagram of a prior art infrared-to-green light up-conversion device without any charge blocking layer, where

Embodiments of the invention are directed to improved infrared imaging devices where emission results from the up-conversion of an IR photodetector coupled with an organic light-emitting device, such as an OLED, where emission of light occurs only under IR irradiation at a sufficiently high voltage. Other embodiments of the invention are directed to a method of fabrication that is relatively low in cost and yields lightweight, highly sensitive devices with high gain and image fidelity while consuming little power. Specific embodiments can incorporate one or more of the organic IR-to-green light up-conversion devices disclosed in Kim et al., PCT/US2010/058015, or Kim et al. *Adv. Mater.* 2010, 22, 2260-3, where, in an exemplary embodiment, a tin phthalocyanine: buckminsterfullerene (SnPc:$C_{60}$) bulk heterostructure layer IR photodetector is connected in series with an fac-tris(2-phenylpyridine)iridium (Ir(ppy)$_3$) based phosphorescent layer as a light emitting layer, where the structure can be generalized by the structure diagrammed in FIG. 1A, which is similar to a conventional OLED.

Figure 1B:
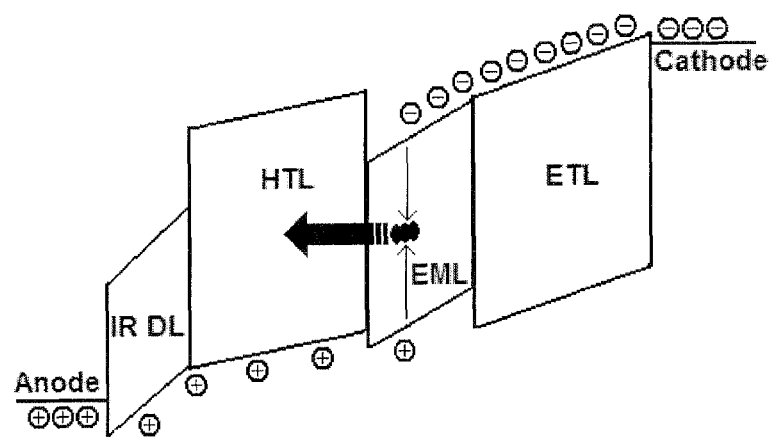

In an all-organic up-conversion device, it can be advantageous to have a poor hole transport IR-sensitizing layer such that the organic light-emitting device, such as an OLED, remains in the off state until IR irradiation occurs. Upon IR photo-excitation, holes are injected into the organic light emitting layer where the holes combine with electrons injected from the cathode to give off light of a shorter wavelength than the incident IR radiation, such as visible light. As in the case of a device with an indium-tin oxide (ITO) anode and IR detecting (absorbing) tin (II) phthalocyanine (SnPc) layer, due to the small difference between the anode's work function and the IR absorber's HOMO, hole injection from the anode occurs at low voltages, as illustrated in FIG. 1B. Hence, light can be generated, even with very little or no IR irradiation, with relatively low voltages applied to the electrodes.

Figure 2A:
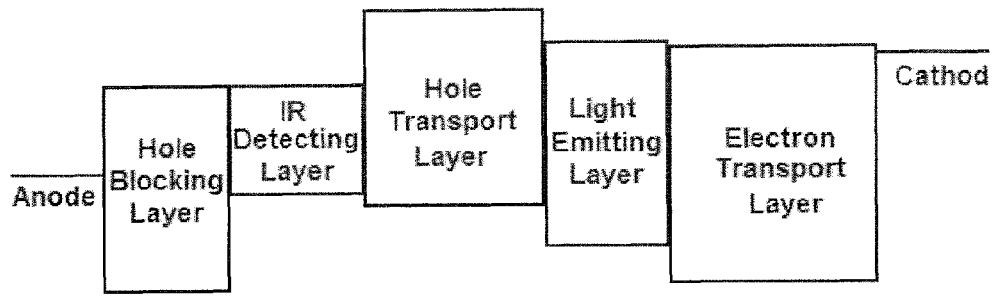
FIGS. 2A-2C show a schematic energy band diagram of an IR-to-green light up-conversion device with hole blocking layer according to an embodiment of the invention, where
Figure 2B:
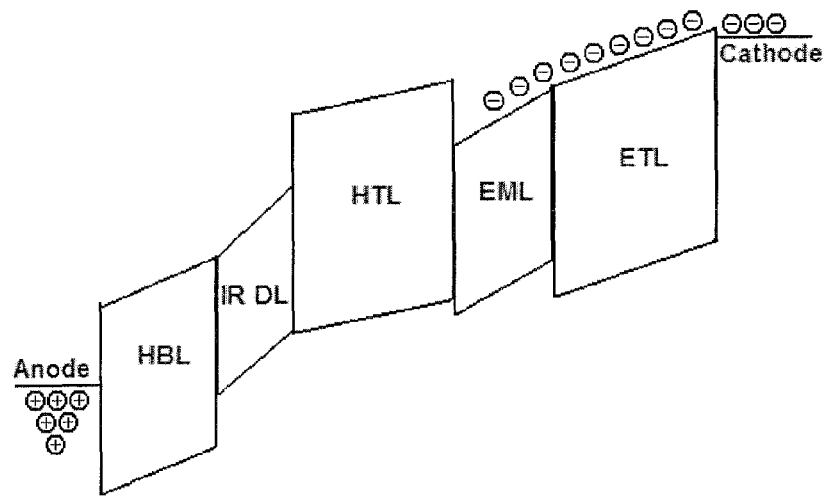
Figure 2C:
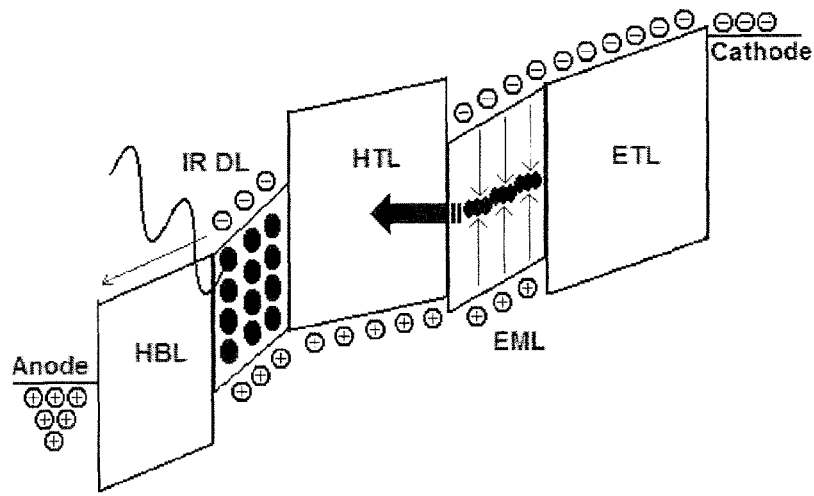

In embodiments of the invention, the performance of an all organic up-conversion device is enhanced by inclusion of a charge blocking layer. In a specific embodiment, a hole blocking layer is placed between an ITO anode and a SnPc IR photodetecting layer, such that hole carriers from the ITO anode are efficiently blocked, suppressing visible luminance of the up-conversion device until a sufficiently high voltages and IR irradiation is applied, as shown in FIGS. 2A, 2B, and 2C. In addition to ITO, other materials that can be employed as an anode include, but are not limited to: Indium Zinc Oxide (IZO), Aluminum Tin Oxide (ATO), Aluminum Zinc Oxide (AZO), and carbon nanotube. In addition to SnPc:$C_{60}$, other organic IR photodetector materials that can be employed include, but are not limited to: tin (II) phthalocyanine (SnPc), aluminum phthalocyanine chloride (AlPcCl), AlPcCl:$C_{60}$, titanyl phthalocyanine (TiOPc), and TiOPc:$C_{60}$. In addition to Ir(ppy)$_3$, other electroluminescent organic light-emitting device, such as an OLED, materials that can be employed include, but are not limited to: poly-[2-methoxy, 5-(2'-ethylhexyloxy) phenylene vinylene] (MEH-PPV), tris-(8-hydroxy quinoline) aluminum (Alq$_3$), and iridium (III) bis[(4,6-difluorophenyl)-pyridinate-N,C2']picolinate (FIrpic). The cathode can be LiF/Al or can be any conductor with the appropriate work function including, but not limited to: Ag, Ca:Mg, LiF/Al/ITO, Ag/ITO, CsCO$_3$/ITO, and Ba/Al. Materials that can be employed as electron transport layers include, but are not limited to: tris[3-(3-pyridyl)-mesityl]borane (3TPYMB), 2,9-Dimethyl-4,7-diphenyl-1,10-phenanthroline (BCP), 4,7-diphenyl-1,10-phenanthroline (BPhen), and tris-(8-hydroxy quinoline) aluminum (Alq$_3$). Materials that can be employed as hole transport layers include, but are not limited to: 1,1-bis[(di-4-tolylamino)phenyl]cyclohexane (TAPC), N,N'-diphenyl-N,N'(2-naphthyl)-(1,1'-phenyl)-4,4'-diamine (NPB), and N,N'-diphenyl-N,N'-di(m-tolyl)benzidine (TPD). Those skilled in the art can readily identify appropriate combinations of anodes, cathodes, IR photodetectors, organic light-emitting device, such as OLED, materials, hole transport layers, and electron transport layers by their relative work functions, highest occupied molecular orbit (HOMO) and lowest unoccupied molecular orbit (LUMO) levels, layer compatibility, and the nature of any desired deposition methods used during their fabrication.

Figure 3A:
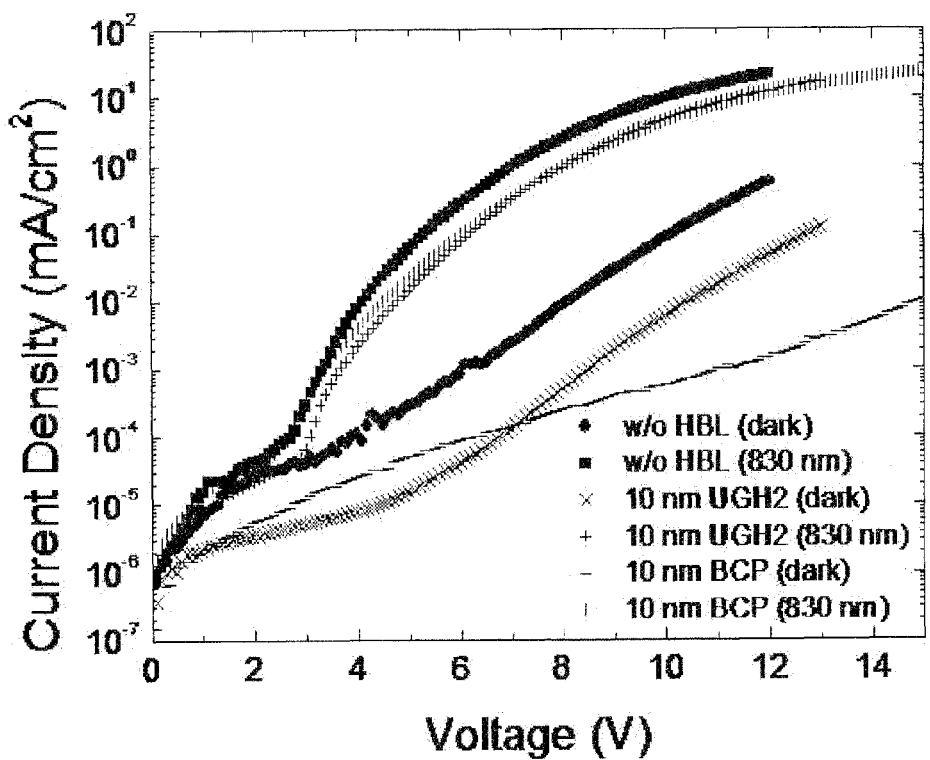
FIGS. 3A-3B show (3A) I-V characteristics and (3B) L-V characteristics of IR-to-green light up-conversion devices with various organic hole blocking layers according to embodiments of the invention with BCP and UGH2 as hole blocking materials under dark and IR irradiation.
Figure 3B:
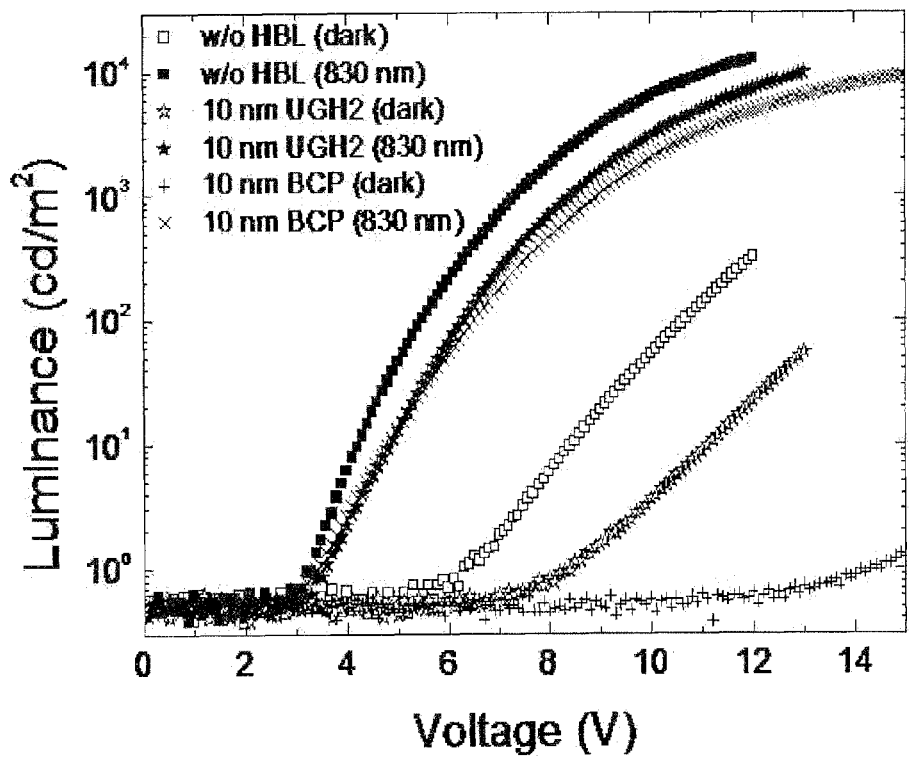

In some embodiments of the invention the hole blocking layer can be an organic compound. FIG. 3A shows I-V characteristics, and FIG. 3B shows L-V characteristics, of IR-to-green light up-conversion devices according to embodiments of the invention fabricated with different organic hole blocking layers, 2,9-Dimethyl-4,7-diphenyl-1,10-phenanthroline (BCP) and p-bis(triphenylsilyly)benzene (UGH2), under dark and IR irradiation. These hole blocking materials possess deep HOMO levels. Because these materials also have small LUMO energy, charge generation between the hole blocking layer and the IR sensitizing layer is negligible. As illustrated in FIGS. 3A and 3B, up-conversion devices with a hole blocking layer have higher turn-on voltage in the dark. In addition to BCP and UGH2, other organic hole blocking layers that can be employed in embodiments of the invention include, but are not limited to: 4,7-diphenyl-1,10-phenanthroline (BPhen), tris-(8-hydroxy quinoline) aluminum (Alq$_3$), 3,5"-N,N'-dicarbazole-benzene (mCP), $C_{60}$, and tris[3-(3-pyridyl)-mesityl]borane (3TPYMB).

Figure 4A:
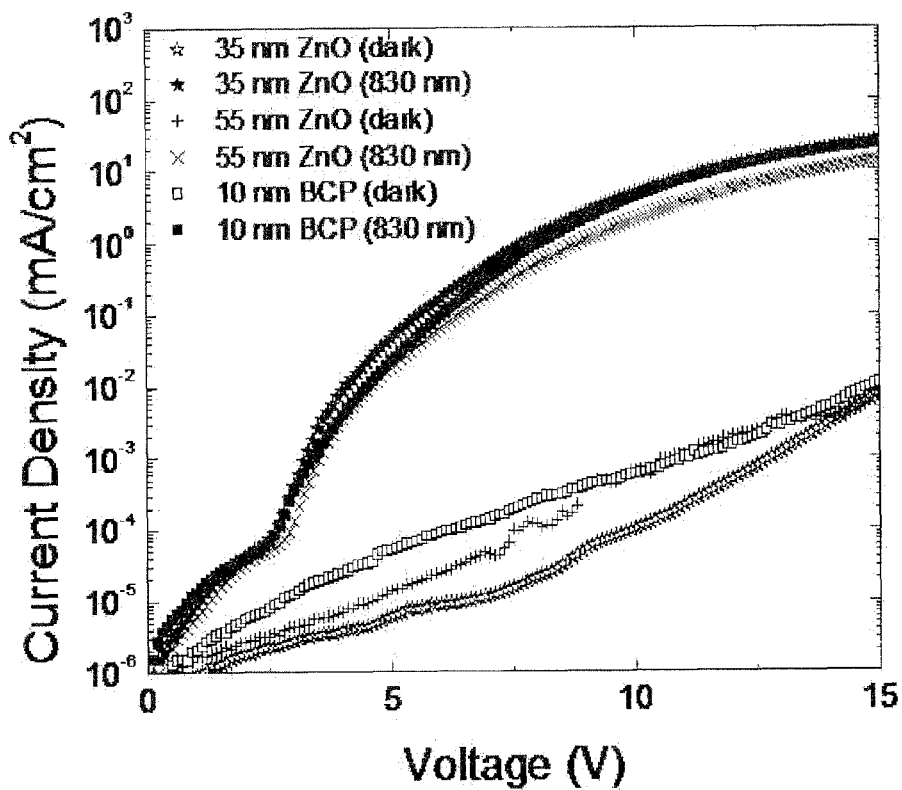
FIGS. 4A-4B show (4A) I-V characteristics and (4B) L-V characteristics of IR-to-green light up-conversion devices with inorganic ZnO hole blocking layers according to embodiments of the invention compared with a device having an organic BCP hole blocking layer according to an embodiment of the invention under dark and IR irradiation.
Figure 4B:
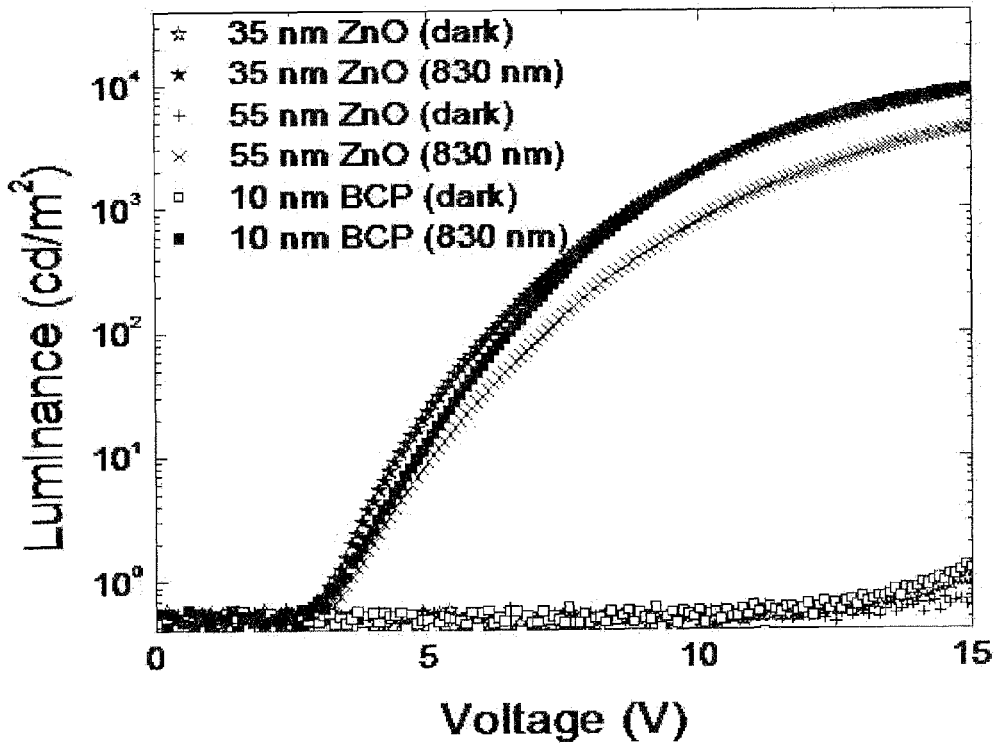

In other embodiments of the invention an inorganic hole blocking layer can be included in the up-conversion device. FIG. 4A shows the I-V characteristics and FIG. 4B shows the L-V characteristics of IR-to-green light up-conversion devices with differing thicknesses of ZnO hole blocking layers and, for comparison, a device with the organic BCP hole blocking layer under dark conditions and under IR irradiation. Devices with ZnO hole blocking layers display similar characteristics to that of BCP. In addition to ZnO, other inorganic hole blocking layers that can be employed in embodiments of the invention include, but are not limited to: TiO$_2$, SiO, SiO$_2$, Si$_3$N$_4$, and Al$_2$O$_3$.

Figure 5A:
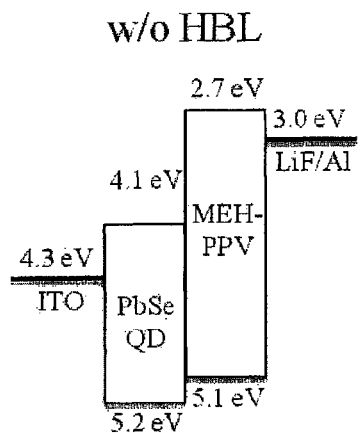
FIGS. 5A-5B show (5A) a schematic energy band diagram and (5B) L-I-V characteristics of a QD based IR-to-visible light up-conversion device without any charge blocking layer under dark and IR irradiation.
Figure 5B:
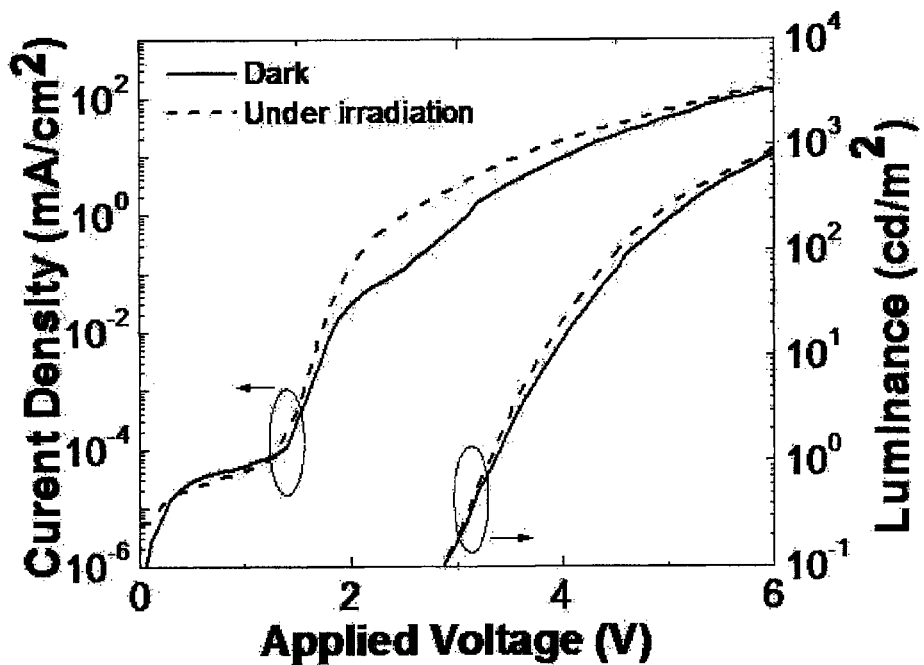
Figure 6A:
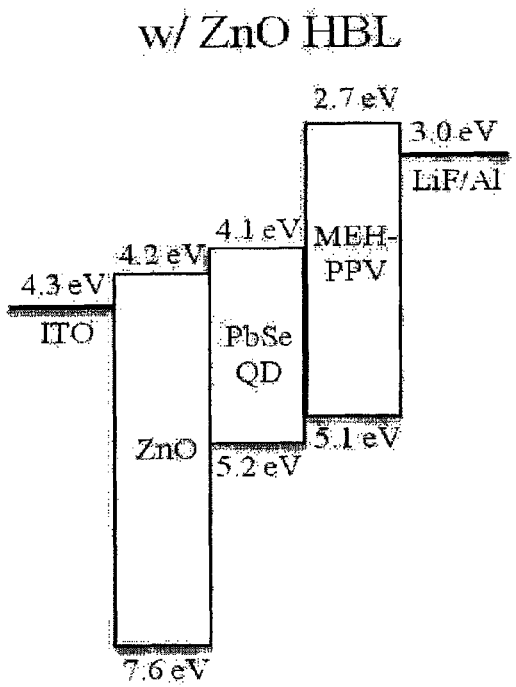
FIGS. 6A-6C show (6A) a schematic energy band diagram, (6B) I-V characteristics, and (6C) L-V characteristics of a QD based IR-to-visible light up-conversion device with ZnO hole blocking layer according to an embodiment of the invention under dark and IR irradiation.
Figure 6B:
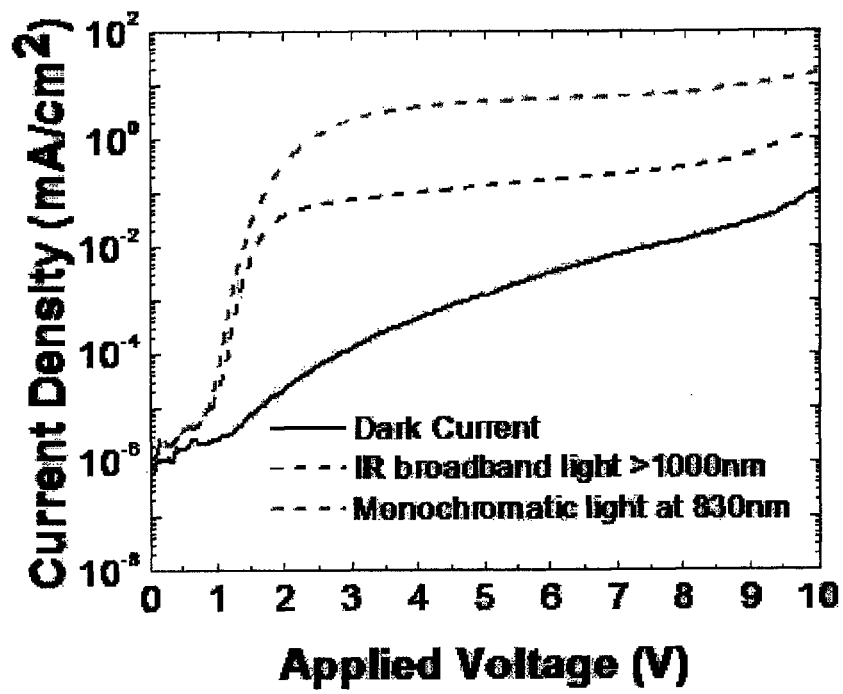
Figure 6C:
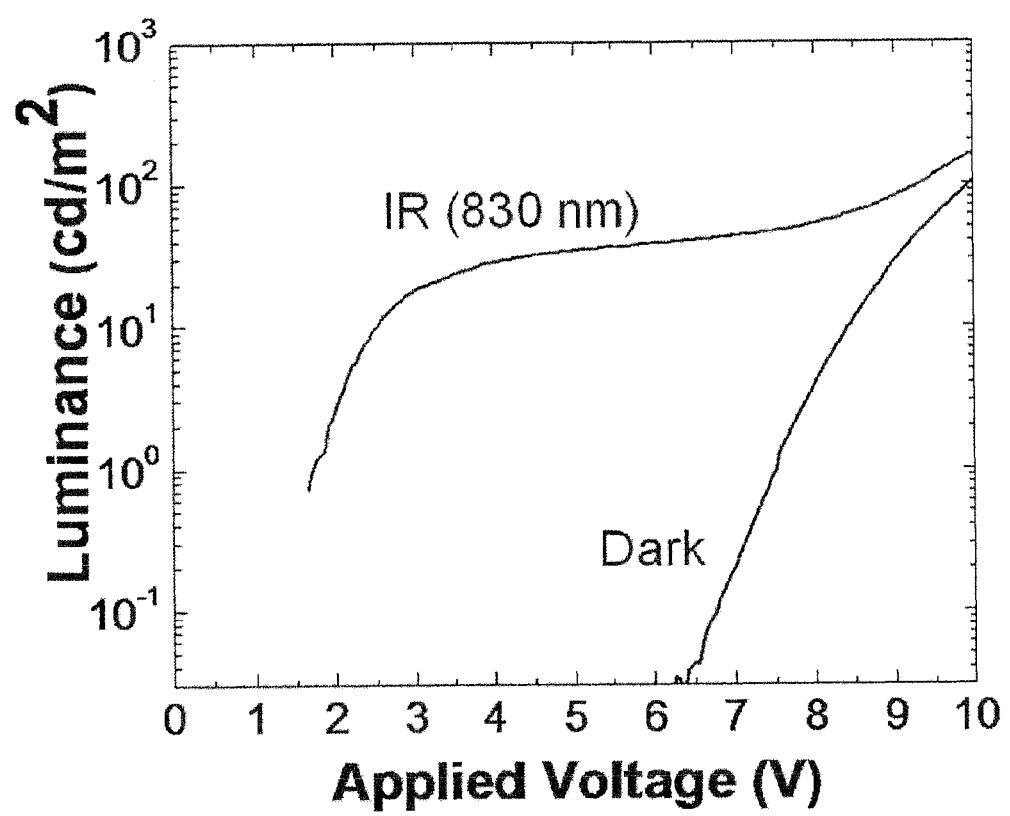

In another embodiment of the invention, the IR photodetecting layer can be inorganic, for example quantum dots (QDs) and the hole blocking layer can be organic or inorganic. For an exemplary up-conversion device lacking a hole blocking layer, shown in FIG. 5A, a layer of PbSe QDs is employed as the IR sensitizer and MEH-PPV is employed as the electroluminescent organic light-emitting device, such as an OLED. The device of FIG. 5A displayed no hole blocking by the QD IR detecting layer, as shown in FIG. 5B where the L-I-V characteristics on the QD IR up-conversion device displays little difference between dark and IR irradiated current densities and luminance with applied voltage, with luminescence occurring at a low voltage. In contrast, a QD IR up-conversion device with a ZnO hole blocking layer, as shown in FIG. 6A, effectively blocks hole injection from the anode in the dark. This is shown by the I-V and L-V characteristics in FIGS. 6B and 6C for a QD IR up-conversion device with a ZnO hole blocking layer. In this embodiment, IR irradiation acts as an effective optical switch. In addition to PbSe, other QDs that can be employed include, but are not limited to: PbS. Other inorganic materials that can be employed as IR detectors include, but are not limited to: Si, Ge, and GaAs.

Embodiments of the invention pertain to methods and apparatus for detecting infrared (IR) radiation and providing an output having a shorter wavelength than the incident IR radiation, such as a visible light output. Because of their compatibility with lightweight rugged flexible plastic substrates, up-conversion devices in accordance with embodiments of the present invention can be used as a component, for example a pixel, for numerous applications including, but not limited to, night vision, range finding, security, and semiconductor wafer inspections.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. A device for sensing infrared (IR) radiation, comprising:
an anode;
a hole blocking layer;
an IR sensing layer, wherein the IR sensing layer is separated from the anode by the hole blocking layer;
an organic light emitting layer, wherein the organic light emitting layer is separated from the anode by the hole blocking layer and the IR sensing layer; and
a cathode, wherein the cathode is separated from the anode by the hole blocking layer, the IR sensing layer, and the organic light emitting layer, wherein the device is configured to apply a potential between the anode and the cathode such that the anode is at a higher potential than the cathode, wherein when the potential is applied between the anode and the cathode and IR radiation is incident on the IR sensing layer, output electromagnetic radiation is generated in the organic light emitting layer.

2. The device according to claim 1, wherein the hole blocking layer comprises a material selected from the group consisting of: BCP, UGH2, BPhen, $Alq_3$, mCP, $C_{60}$, 3TPYMB, ZnO nanoparticles, and combinations thereof.

3. The device according to claim 1, wherein the organic light emitting layer only generates the output electromagnetic radiation when IR radiation is incident on the IR sensing layer.

4. The device according to claim 1, wherein the anode is transparent and the cathode is transparent.

5. The device according to claim 1, wherein the anode comprises a material selected from the group consisting of: ITO, IZO, ATO, AZO, and carbon nanotubes.

6. The device according to claim 1, wherein the cathode comprises a material selected from the group consisting of: LiF/Al, Ag, Ca:Mg, LiF/Al/ITO, Ag/ITO, $CsCO_3$/ITO, and Ba/Al.

7. The device according to claim 1, wherein the organic light emitting layer comprises a material selected from the group consisting of: MEH-PPV, $Alq_3$, and FIrpic.

8. The device according to claim 1, wherein the IR sensing layer is an organic IR sensing layer.

9. The device according to claim 8, wherein the organic IR sensing layer comprises a material selected from the group consisting of: SnPc, SnPc:$C_{60}$, AlPcCl, AlPeCl:$C_{60}$, TiOPc, and TiOPc:$C_{60}$.

10. The device according to claim 1, wherein the IR sensing layer is an inorganic IR sensing layer.

11. The device according to claim 10, wherein the inorganic IR sensing layer comprises a material selected from the group consisting of: PbSe and PbS.

12. The device according to claim 1, further comprising a hole transport layer, wherein the hole transport layer separates the organic light emitting layer from the IR sensing layer.

13. The device according to claim 12, wherein the hole transport layer comprises a material selected from the group consisting of: TAPC, NPB, and TPD.

14. The device according to claim 1, further comprising an electron transport layer, wherein the electron transport layer separates the organic light emitting layer from the cathode.

15. The device of claim 14, wherein the electron transport layer comprises a material selected from the group consisting of: 3TPYMB, BCP, BPhen, and $Alq_3$.

16. The device according to claim 1, wherein the output electromagnetic radiation is generated in the organic light emitting layer via electrons injected from the cathode combining with holes injected from the IR sensing layer.

17. The device according to claim 16, further comprising an electron transport layer, wherein the electron transport layer separates the or organic light emitting layer from the cathode, wherein the electrons injected from the cathode travel through an electron transport layer from the cathode to the light emitting layer.

18. The device according to claim 16, further comprising a hole transport layer, wherein the hole transport layer separates the organic light emitting layer from the IR sensing layer, wherein the holes injected from the IR sensing layer travel through a hole transport layer from the IR sensing layer to the light emitting layer.

19. The device according to claim 1, wherein output electromagnetic radiation is not generated until the potential reaches a threshold magnitude.

20. The device according to claim 1, wherein charge generation between the hole blocking layer and the IR sensing layer is negligible.

21. The device according to claim 1, wherein the output electromagnetic radiation has an output wavelength that is shorter than an input wavelength of the IR radiation incident on the IR sensing layer.

22. A method of detecting infrared (IR) radiation, comprising:
positioning a device in a region of interest, wherein the device comprises:
an anode;
a hole blocking layer;
an IR sensing layer, wherein the IR sensing layer is separated from the anode by the hole blocking layer;
an organic light emitting layer, wherein the organic light emitting layer is separated from the anode by the hole blocking layer and the IR sensing layer; and a cathode, wherein the cathode is separated from the anode by the hole blocking layer, the IR sensing layer, and the organic light emitting layer, wherein the device is configured to apply a potential between the anode and the cathode such that the anode is at a higher potential than the cathode, wherein when the potential is applied between the anode and the cathode and IR radiation is incident on the IR sensing layer, output electromagnetic radiation is generated in the organic light emitting layer; and monitoring for the output electromagnetic radiation.

23. The method according to claim 22, wherein the hole blocking layer comprises a material selected from the group consisting of: BCP, UGH2, BPhen, $Alq_3$, mCP, $C_{60}$, 3TPYMB, ZnO nanoparticles, and combinations thereof.

24. The method according to claim 22, wherein the organic light emitting layer only generates the output electromagnetic radiation when IR radiation is incident on the IR sensing layer.

25. The method according to claim 22, wherein the anode is transparent and the cathode is transparent.

26. The method according to claim 22, wherein the anode comprises a material selected from the group consisting of: ITO, IZO, ATO, AZO, and carbon nanotubes.

27. The method according to claim 22, wherein the cathode comprises a material selected from the group consisting of: LiF/Al, Ag, Ca:Mg, LiF/Al/ITO, Ag/ITO, $CsCO_3$/ITO, and Ba/Al.

28. The method according to claim 22, wherein the organic light emitting layer comprises a material selected from the group consisting of: MEH-PPV, $Alq_3$, and FIrpic.

29. The method according to claim 22, wherein the IR sensing layer is an organic IR sensing layer.

30. The method according to claim 29, wherein the organic IR sensing layer comprises a material selected from the group consisting of: SnPc, SnPc:$C_{60}$, AlPcCl, AlPcCl:$C_{60}$, TiOPc, and TiOPc:$C_{60}$.

31. The method according to claim 22, wherein the IR sensing layer is an inorganic IR sensing layer.

32. The method according to claim 31, wherein the inorganic IR sensing layer comprises a material selected from the group consisting of: PbSe and PbS.

33. The method according to claim 22, wherein the device further comprises a hole transport layer, wherein the hole transport layer separates the organic light emitting layer from the IR sensing layer.

34. The method according to claim 33, wherein the hole transport layer comprises a material selected from the group consisting of: TAPC, NPB, and TPD.

35. The method according to claim 22, wherein the device further comprises an electron transport layer, wherein the electron transport layer separates the organic light emitting layer from the cathode.

36. The method of claim 35, wherein the electron transport layer comprises a material selected from the group consisting of: 3TPYMB, BCP, BPhen, and $Alq_3$.

37. The method according to claim 22, wherein the output electromagnetic radiation is generated in the organic light emitting layer via electrons injected from the cathode combining with holes injected from the IR sensing layer.

38. The method according to claim 37, wherein the device further comprises an electron transport layer, wherein the electron transport layer separates the organic light emitting layer from the cathode, wherein the electrons injected from the cathode travel through an electron transport layer from the cathode to the light emitting layer.

39. The method according to claim 37, wherein the device further comprises a hole transport layer, wherein the hole transport layer separates the organic light emitting layer from the IR sensing layer, wherein the holes injected from the IR sensing layer travel through a hole transport layer from the IR sensing layer to the light emitting layer.

40. The method according to claim 22, wherein output electromagnetic radiation is not generated until the potential reaches a threshold magnitude.

41. The method according to claim 22, wherein charge generation between the hole blocking layer and the IR sensing layer is negligible.

42. The method according to claim 22, wherein the output electromagnetic radiation has an output wavelength that is shorter than an input wavelength of the IR radiation incident on the IR sensing layer.

* * * * *